(12) United States Patent
Saverio (10) Patent No.: US 8,130,018 B2
(45) Date of Patent: Mar. 6, 2012

(54) LATCH MODULE AND FREQUENCY DIVIDER

(75) Inventor: Trotta Saverio, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/920,598

(22) PCT Filed: Mar. 20, 2008

(86) PCT No.: PCT/IB2008/051059
§ 371 (c)(1),
(2), (4) Date: Sep. 2, 2010

(87) PCT Pub. No.: WO2009/115865
PCT Pub. Date: Sep. 24, 2009

(65) Prior Publication Data
US 2011/0018594 A1    Jan. 27, 2011

(51) Int. Cl.
*H03K 3/286* (2006.01)
*H03B 19/06* (2006.01)

(52) U.S. Cl. ........ 327/223; 327/115; 327/117; 327/118; 327/202; 327/212; 327/218; 377/47

(58) Field of Classification Search .......... 327/113–115, 327/117, 118, 199, 202, 203, 207–212, 218, 327/223; 377/47, 48
See application file for complete search history.

(56) References Cited

U.S. PATENT DOCUMENTS

| | | | |
|---|---|---|---|
| 5,510,734 A * | 4/1996 | Sone | 327/65 |
| 6,459,308 B1 * | 10/2002 | Tung et al. | 327/114 |
| 6,538,486 B1 | 3/2003 | Chen et al. | |
| 6,861,888 B2 * | 3/2005 | Hsieh | 327/208 |
| 7,142,029 B2 * | 11/2006 | Gregory | 327/202 |
| 7,663,414 B2 * | 2/2010 | Copani et al. | 327/115 |
| 7,701,258 B2 * | 4/2010 | Chiu et al. | 327/57 |

(Continued)

FOREIGN PATENT DOCUMENTS

WO    2005/002053 A    1/2005

OTHER PUBLICATIONS

Byung-Guk Kim et al: "A 20 Gb/s 1:4 DEMUX Without Inductors and Low-Power Divide-by-2 Circuit in 0.13 CMOS Technology" IEEE Journal of Solid-State Circuits, IEEE Service Center, Piscataway, NJ, US, vol. 43, No. 2, Feb. 1, 2008, pp. 541-549.

(Continued)

*Primary Examiner* — Patrick O'Neill (57) ABSTRACT

A latch module comprising a sense pair of transistor elements coupled together for sensing a differential input signal at input terminals, a level-shift module for producing a differential output signal at output terminals, and a regenerative pair of transistor elements coupled together and with the input pair for holding the output signal through the level-shift module. The latch module also includes a pair of gate transistor elements connected in series respectively with the sense pair of transistor elements and with the regenerative pair of transistor elements and responsive to an alternating differential gate signal to activate alternately the sense pair during sense periods and the regenerative pair during store periods. A current injector provides asymmetric operation by injecting current between at least one of the gate transistors and the corresponding sense or regenerative pair of transistor elements so that the sense periods are of different duration from the store periods.

6 Claims, 6 Drawing Sheets

U.S. PATENT DOCUMENTS

2003/0132791 A1   7/2003   Hsieh
2005/0231258 A1*  10/2005  Suzuki et al. ............. 327/218

OTHER PUBLICATIONS

S. Trotta et al: "A Novel Design of an Asymmetric D-Latch" IEEE, Topical Meeting on Silicon Monolithic Integrated Circuits in RF Systems, Sep. 2004, pp. 264-264.

Yasuyuki Suzuki et al: "120-Gb/s Multiplexing and 110-Gb/s Demultiplexing ICs" IEEE, Journal of Solid-State Circuits, vol. 39, No. 12, Dec. 2004, pp. 2397-2402.

Saverio Trotta et al: "110-GHz Static Frequency Divider in SiGe Bipolar Technology" IEEE, CSIC 2005 Digest, pp. 291-294.

International Search Report and Written Opinion correlating to PCT/IB2008/051059 dated Nov. 14, 2008.

* cited by examiner

PRIOR ART

LATCH MODULE AND FREQUENCY DIVIDER

FIELD OF THE INVENTION

This invention relates to a latch module and to a frequency divider. Frequency dividers are used in a wide variety of applications, including transmitter and receiver apparatus, for example. Latch modules are used in frequency dividers and will be described with reference to such application but can also be used in other apparatus, such as shift registers, including pseudo-random binary sequence generators and linear feedback shift registers, for example.

BACKGROUND OF THE INVENTION

Static frequency dividers operating up to 150 GHz have been presented using latch modules in hetero-junction bipolar transistor ('HBT') technologies. The article "A novel design of an asymmetric D-latch", IEEE SiRF, September 2004 describes a 110 GHz wide range static frequency divider, which has a divide ratio of four and consists of two master-slave flip-flops, an input clock buffer and an output buffer. The input buffer improves the input sensitivity at low frequencies by increasing the slew rate of the clock signal. On the other hand its bandwidth limits the maximum operational frequency of the divider.

The article "120-Gb/s Multiplexing and 110-Gb/s Demultiplexing ICs" IEEE JOURNAL OF SOLID-STATE CIRCUITS, VOL. 39, NO. 12, December 2004, describes high-speed operation in a latch design using asymmetric current levels in the reading and the holding paths of the latch, the duration of the read period being longer than the store period. Different sizes for transistors in the latch are used to obtain the asymmetric current levels: the emitter size of the transistors in the holding circuit is smaller than the size in the reading circuit. However, the performance at low frequencies is limited by the difference in the size.

The article "110-GHz static frequency divider in SiGe bipolar technology", IEEE CSICS, October 2005 describes using different DC voltage levels for the clock signal than the inverted-clock signal at the input of the latch. In this way, the performance of the flip-flop is improved at high frequencies. Level shift blocks are used to apply the clock signal to the flip-flop. The voltage level shift can be accomplished by cascaded emitter followers and for large DC offset more than two emitter followers are needed. This article then proposes using the same emitter followers in the Level Shift Block for both Clk and Clk_n paths in the latch. The emitter followers operate at the same current density but a resistor is added in the first emitter follower of the Clk_n path in the Level Shift Block to achieve the DC offset. The performance of this divider depends on the value of the "DC-offset" resistor. With a very large resistance, it is possible to achieve very high operational frequency, but at the expense of the operational frequency range of the divider.

SUMMARY OF THE INVENTION

The present invention provides a frequency divider and a latch module as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
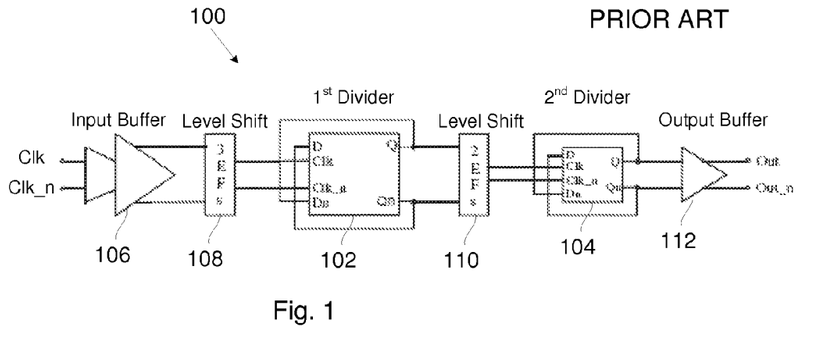
FIG. 1 is a block schematic diagram of a known divide-by-four frequency divider.

FIG. 1 shows the structure of a known divide-by-four frequency divider 100, as described in the article "110-GHz static frequency divider in SiGe bipolar technology", IEEE CSICS, October 2005. The frequency divider comprises a first divide-by-two frequency divider module 102 and a second divide-by-two module 104. The input clock signals Clk and Clk_n are applied to an input buffer 106, whose output is passed to a first level shift block 108 comprising three cascaded emitter follower transistor stages for each clock path. The level-shifted clock signals are applied to the clock and inverted clock inputs of the first frequency divider module 102, whose output is passed to a second level shift block 110 comprising two cascaded emitter follower transistor stages for each clock path. The level-shifted clock signals from the second block 110 are applied to the clock and inverted clock inputs of the second frequency divider module 104, whose output is passed to an output buffer 112.

Figure 2:
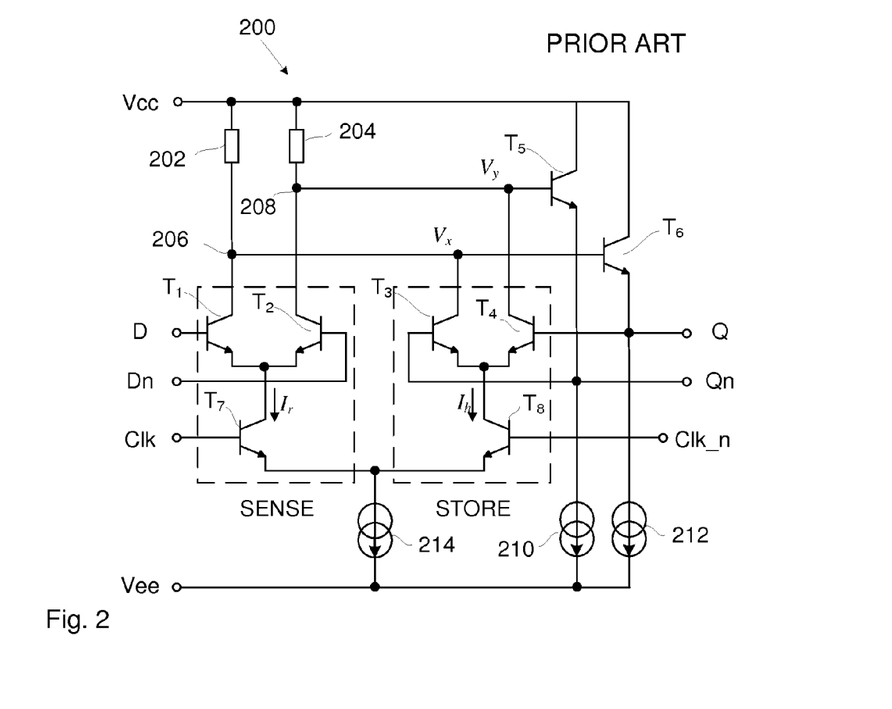
FIG. 2 is a schematic diagram of a latch module in the frequency divider of FIG. 1.

The divide-by-two frequency divider modules 102 and 104 are flip-flops which each comprise two gated D latches 200 as shown in FIG. 2. The latch 200 comprises an emitter coupled pair of sense (or read) transistors $T_1$ and $T_2$, whose bases are connected to input terminals D and Dn, and an emitter coupled pair of regenerative (store or hold) transistors $T_3$ and $T_4$, whose bases are connected to output terminals Q and Qn. A resistor 202 connects the collectors of both the transistors $T_1$ and $T_3$ to a supply rail $V_{cc}$ and a resistor 204 connects the collectors of both the transistors $T_2$ and $T_4$ to the supply rail $V_{cc}$. A level-shift transistor $T_5$ has its base connected to a node 208 between the collectors of the transistors $T_2$ and $T_4$ and the resistor 204, the collector of the transistor $T_5$ being connected to the supply rail $V_{cc}$ and its emitter being connected to the output terminal Q and, through a constant current source 210, to a supply rail $V_{ee}$. A level-shift transistor $T_6$ has its base connected to the node 206 between the collectors of the transistors $T_1$ and $T_3$ and the resistor 202, the collector of the transistor $T_6$ being connected to the supply rail $V_{cc}$ and its emitter being connected to the output terminal Qn and, through a constant current source 212, to a supply rail $V_{ee}$.

An emitter coupled pair of gate transistors $T_7$ and $T_8$, whose bases are connected to clock terminals Clk and Clk_n, have their collectors connected respectively to the common emitters of the transistor pair $T_1$ and $T_2$, and to the common emitters of the transistor pair $T_3$ and $T_4$. The common emitters of the gate transistors $T_7$ and $T_8$ are connected through a constant current source 214 to the supply rail Vee. In operation, at the rising edge of the clock pulse Clk, the gate transistor $T_7$ switches on, the other gate transistor $T_8$, whose base receives the inverse clock pulse Clk_n, switches off and one of the transistors $T_1$ and $T_2$ of the sense pair conducts while the other is cut off as a function of the states of the D and Dn inputs. The voltages at the nodes 206 and 208 rise and fall correspondingly and the transistors $T_5$ and $T_6$ apply corresponding voltages to the output terminals Q and Qn. At the rising edge of the negative clock pulse Clk_n, the gate transistor $T_8$ switches on, the other gate transistor $T_7$ switching off, one of the transistors $T_3$ and $T_4$ of the regenerative pair conducts, maintaining the states of the outputs Q and Qn, through the level-shift transistors $T_5$ and $T_6$, while the sense pair of transistors $T_1$ and $T_2$ are cut-off by the gate transistor $T_7$.

Figure 3:
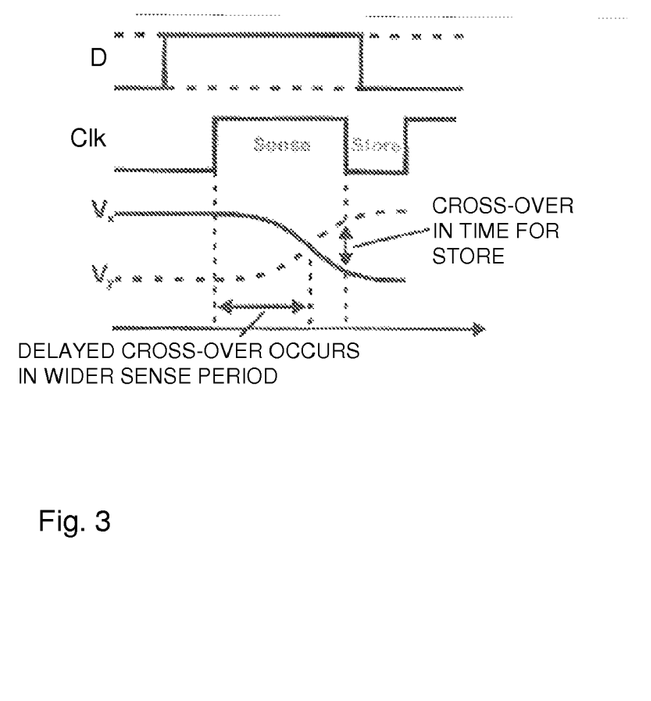
FIG. 3 is a graph of signals appearing in operation of high-speed frequency dividers such as that of FIG. 1.

The current levels in the reading and the holding paths of the latch (the gate transistors $T_7$ and $T_8$) are arranged to be asymmetric, as shown in FIG. 3. The data signal D shown is not synchronous with the clock signal Clk and, on the rising edge of the clock signal, when the latch changes state, the voltages $V_x$ and $V_y$ at the nodes 206 and 208 slew progressively, due to delays in the latch itself but also in the buffer 106. At high frequencies, the duration of the sense period would become insufficient for the voltages $V_x$ and $V_y$ to cross over before the store period starts but asymmetry introduced into the latch current levels prolongs the sense period and shortens the store period, enabling higher frequency operation.

In one known circuit, different sizes for transistors in the latch are used to obtain the asymmetric current levels: the emitter size of the transistors in the store path is smaller than the size in the sense path. However, the performance at low frequencies is limited by the difference in the size.

Figure 4:
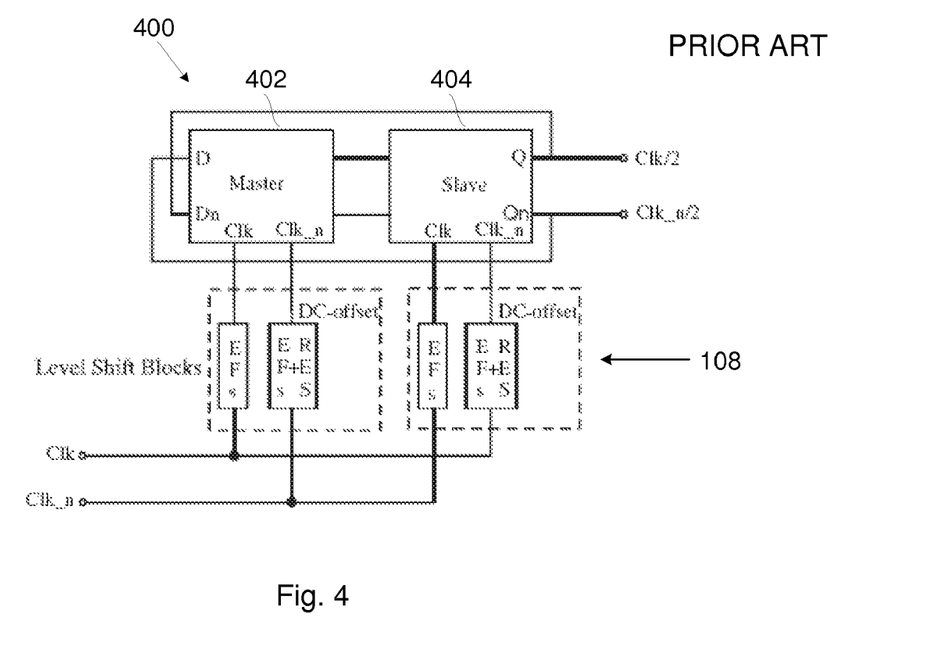
FIG. 4 is a more detailed block schematic diagram of a divide-by-two frequency divider module in the frequency divider of FIG. 1.
Figure 5:
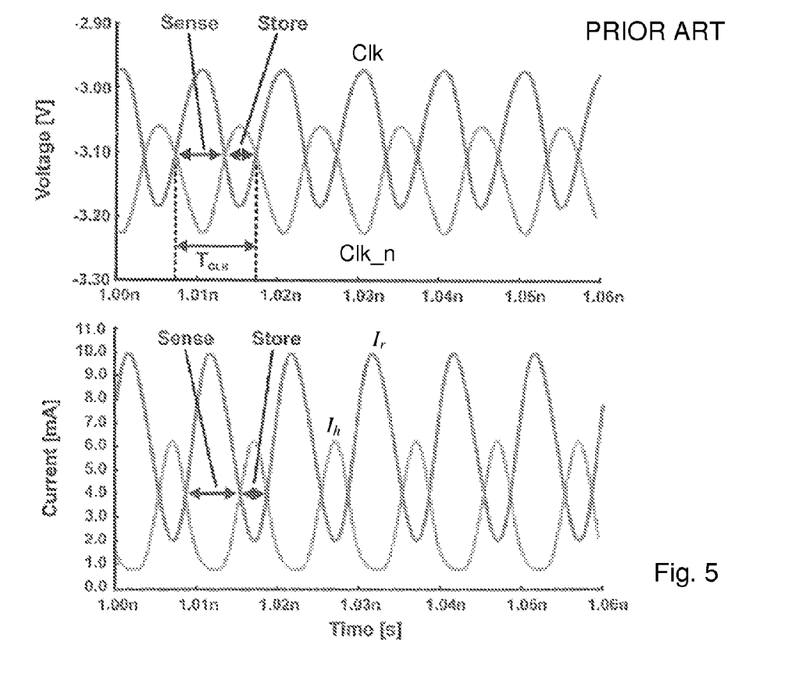
FIG. 5 is a graph of signals appearing in operation of the frequency divider module of FIG. 4.

Another known circuit 400 described in the article "110-GHz static frequency divider in SiGe bipolar technology", IEEE CSICS, October 2005 is shown in present FIG. 4. The divide-by-two frequency divider module 400 comprises two latches 402 and 404 as shown in FIG. 2 in master-slave configuration, the slave latch inputs D and Dn receiving the outputs Q and Qn of the master latch 402 and the outputs Q and Qn of the slave latch 404 being fed back inverted to the inputs Dn and D of the master latch 402 respectively. The outputs Q and Qn of the slave latch 404 run at half the frequency of the signals Clk and Clk_n. This known frequency divider module 400 uses cascaded emitter followers ('EFs') in the Level Shift Blocks for both Clk and Clk_n paths. The emitter followers operate at the same current density but a resistor is added ('EFs+RES') in the first emitter follower of the Clk_n path in the Level Shift Block to achieve a DC voltage offset between the clock signals Clk and Clk_n. FIG. 5 shows the relationship of the sense and read currents $I_r$ and $I_h$ in the latches 402 and 404 to the voltages of the clock signals Clk and Clk_n applied to the latches 402 and 404.

Figure 6:
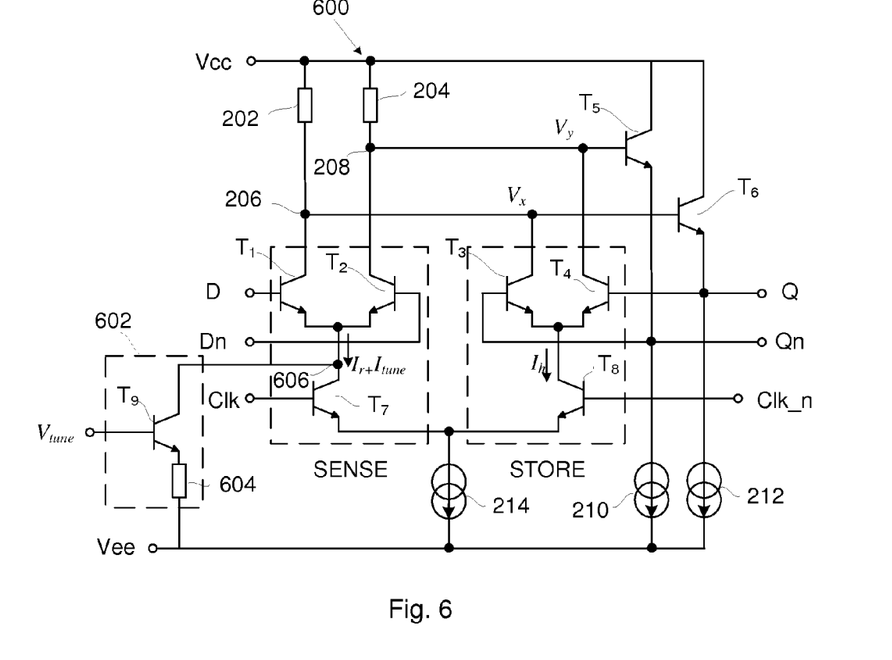
FIG. 6 is a schematic diagram of a latch module in accordance with an embodiment of the present invention, given by way of example.

FIG. 6 shows a gated D latch module 600 in accordance with an embodiment of the present invention providing asymmetric operation without the multiple cascaded emitter followers of the known circuit 400 and without penalising low frequency operation. In FIG. 6, elements similar to those in FIGS. 1, 2 and 4 bear similar references, even if their function is not necessarily identical.

The latch module 600 comprises an emitter coupled input pair of transistor elements $T_1$ and $T_2$ coupled together and whose bases are connected to input terminals D and Dn for sensing a differential input signal at terminals D and Dn, a level-shift module comprising transistors $T_5$ and $T_6$ responsive to the state of the input pair for producing a differential output signal at output terminals Q and Qn, and a regenerative pair of transistor elements $T_3$ and $T_4$, whose bases are connected to output terminals Q and Qn for holding the output signal. A resistor 202 connects the collectors of both the transistors $T_1$ and $T_3$ to a supply rail $V_{cc}$ and a resistor 204 connects the collectors of both the transistors $T_2$ and $T_4$ to the supply rail $V_{cc}$. The level-shift transistors $T_6$, $T_5$ have their bases connected to nodes 206, 208 between the collectors of the transistors $T_1$, $T_3$ and $T_2$, $T_4$ and the resistors 202, 204 respectively, their collectors connected to the supply rail $V_{cc}$ and their emitters connected to the output terminal Q, Qn and, through constant current sources 212, 210, to a supply rail $V_{ee}$.

An emitter coupled pair of gate (clock) transistor elements $T_7$ and $T_8$, whose bases are connected to clock terminals Clk and Clk_n, are connected in series respectively with the input pair of transistor elements $T_1$ and $T_2$ and with the regenerative pair of transistor elements $T_3$ and $T_4$ and are responsive to an alternating differential clock signal at Clk and Clk_n to activate alternately the input pair during sense periods and the regenerative pair during store periods. The common emitters of the gate transistors $T_7$ and $T_8$ are connected through a constant current source 214 to the supply rail Vee.

In operation, at the rising edge of the clock pulse Clk, the gate transistor $T_7$ switches on, the other gate transistor $T_8$, whose base receives the inverse clock pulse Clk_n, switches off and one of the transistors $T_1$ and $T_2$ of the sense pair conducts while the other is cut off as a function of the states of the D and Dn inputs. The voltages at the nodes 206 and 208 rise and fall correspondingly and the level-shift transistors $T_5$ and $T_6$ apply corresponding voltages to the output terminals Q and Qn. At the rising edge of the negative clock pulse Clk_n, the gate transistor $T_8$ switches on, one of the transistors $T_3$ and $T_4$ of the regenerative pair conducts, maintaining the states of the outputs Qn and Q through the level-shift transistors $T_5$ and $T_6$, while the sense pair of transistors $T_1$ and $T_2$ are cut-off by the gate transistor $T_7$.

Asymmetric operation is provided by a current injector 602 injecting current between at least one of the gate transistors $T_7$ and $T_8$ and the corresponding sense or regenerative pair of transistor elements $T_1$, $T_2$ or $T_3$, $T_4$ so that the sense periods are of greater duration than the store periods. In the embodiment of FIG. 6, the current injector 602 is connected for injecting current to the input pair of transistor elements $T_1$, $T_2$ in parallel with the corresponding gate transistor element $T_7$.

The current injector 602 is responsive to a tuning signal $V_{tune}$ to control the relative durations of the sense periods and the store periods.

Figure 7:
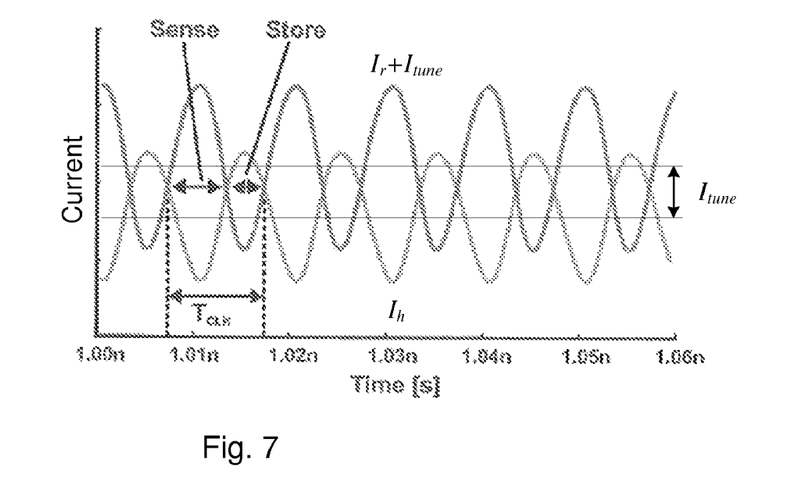
FIG. 7 is a graph of signals appearing in operation of the latch module of FIG. 6.

In the embodiment of the invention illustrated in FIG. 6, the current injector 602 injects a DC current $I_{tune}$ between the gate transistor $T_7$ and the corresponding input pair of transistor elements $T_1$, $T_2$. The current injector 602 comprises a current source comprising a transistor $T_9$ whose base receives the voltage $V_{tune}$, whose emitter is connected through a resistor 604 to the supply rail Vee and whose collector is connected to a node 606 between the collector of the gate transistor $T_7$ and the common emitters of the sense pair of transistor elements $T_1$, $T_2$. No extra current is injected at the regenerative pair of transistors $T_3$ and $T_4$ and no level shift is applied to the clock signals Clk and Clk_n. The current $(I_r+I_{tune})$ in the sense pair of transistors $T_1$ and $T_2$ and the current $I_h$ in the regenerative pair of transistors $T_3$ and $T_4$ are shown in FIG. 7 and are shifted relative to each other in level by the amount $I_{tune}$. Consequently, the sense period duration is prolonged while the store period is shortened.

Figure 8:
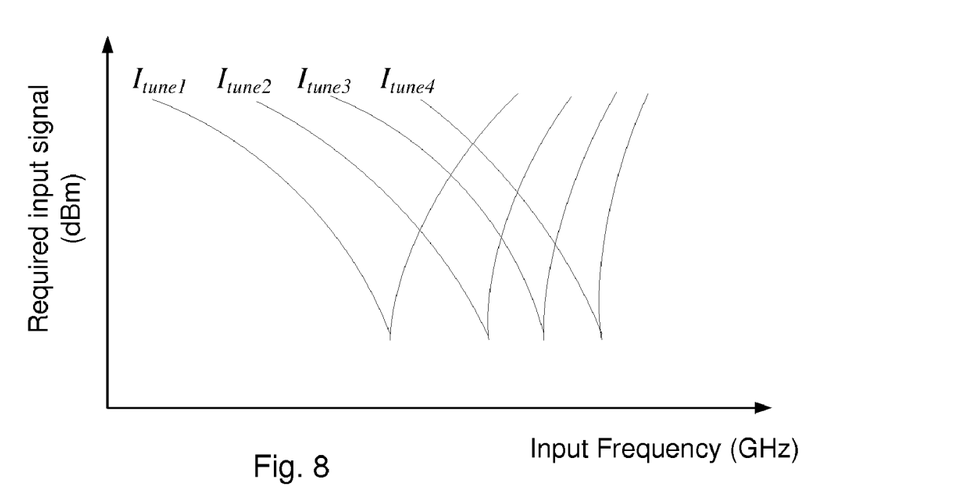
FIG. 8 is a graph of minimum required input signal level against operating frequency for different tuning voltages in the latch module of FIG. 6.

The voltage $V_{tune}$ can be used to adjust the current $I_{tune}$ to adapt the locking frequency range of the divider to the desired operating frequency range, as shown in FIG. 8 for different values $I_{tune1}$, $I_{tune2}$, $I_{tune3}$, and $I_{tune4}$. In particular, the position of the minimum required input signal level can be adapted to coincide with the operating frequency range.

Figure 9:
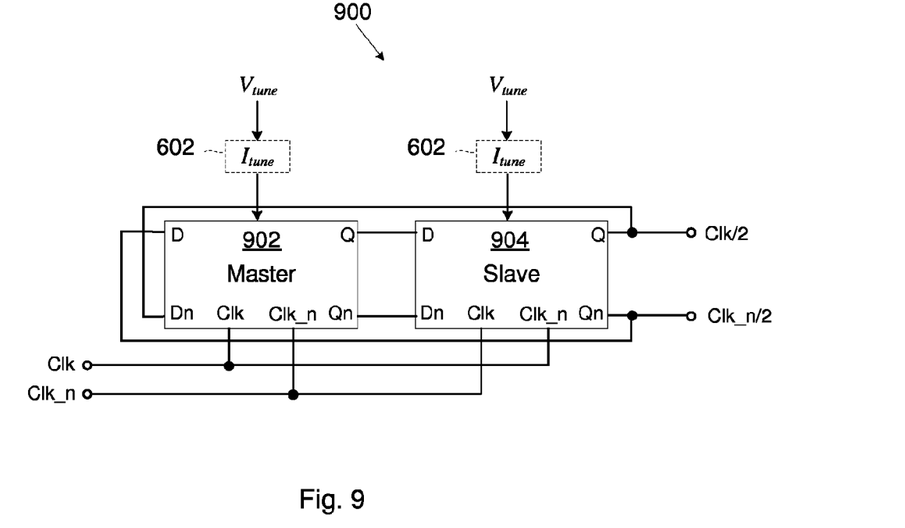
FIG. 9 is a block schematic diagram of a divide-by-two frequency divider module in accordance with an embodiment of the present invention, given by way of example, and including the latch module of FIG. 6.

FIG. 9 shows a divide-by-two frequency divider module 900 in accordance with an embodiment of the present invention, comprising two latch modules 902 and 904 as shown in FIG. 6 in master-slave configuration, the slave latch inputs D and Dn receiving the outputs Q and Qn of the master latch 902 and the outputs Q and Qn of the slave latch 904 being fed back inverted to the inputs Dn and D of the master latch 902 respectively. The outputs Q and Qn of the slave latch 904 run at half the frequency of the signals Clk and Clk_n. Each of the latches 902 and 904 comprises a current injector 602, as in FIG. 6, responsive to a tuning signal $V_{tune}$ to control the relative durations of the sense periods and the store periods. No common-emitter level shift blocks are needed, saving considerable circuit area and power.

Figure 10:
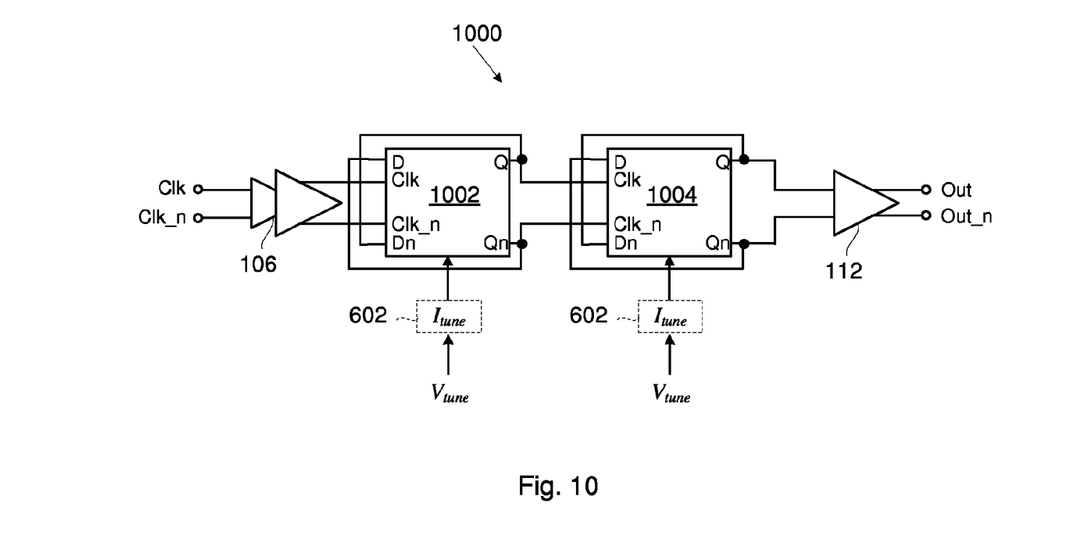
FIG. 10 is a block schematic diagram of a divide-by-four frequency divider module in accordance with an embodiment of the present invention, given by way of example, and including the divide-by-two frequency divider module of FIG. 9.

FIG. 10 shows a divide-by-four frequency divider 1000 comprising a first divide-by-two frequency divider module 1002 and a second divide-by-two module 1004 of the kind shown in FIG. 9. The input clock signals Clk and Clk_n are applied to an input buffer 106, whose output is passed to the gate and inverted gate inputs of the first frequency divider module 1002. The output of the first frequency divider module 1002 is passed to the gate and inverted gate inputs of the second frequency divider module 1004, whose output is passed to an output buffer 112. The output signals Out and Out_n from the second frequency divider module 1004 run at one quarter the frequency of the signals Clk and Clk_n at the input of the first frequency divider module 1002.

Figure 11:
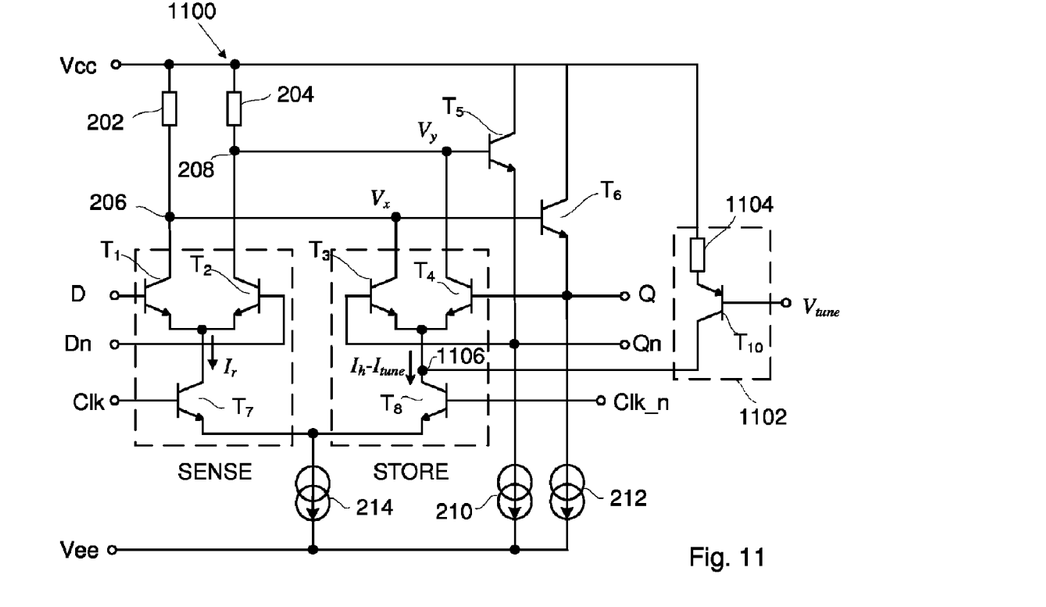
FIG. 11 is a schematic diagram of a latch module in accordance with another embodiment of the present invention, given by way of example.

FIG. 11 shows a gated D latch module 1100 in accordance with another embodiment of of the present invention providing asymmetric operation without the multiple cascaded emitter followers of the known circuit 400 and without penalising low frequency operation. In FIG. 11, elements similar to those in previous Figures bear similar references, even if their function is not necessarily identical.

The latch module 1100 is similar to the latch module 600 of FIG. 6 except that the current injector 602 injecting current to the input pair of transistor elements $T_1$, $T_2$ in parallel with the corresponding gate transistor element $T_7$ so that the sense periods are of greater duration than the store periods is replaced by a current injector 1102 injecting a current of opposite polarity in parallel with the regenerative pair of transistor elements $T_3$, $T_4$ to the corresponding gate transistor element $T_8$. More specifically, the current injector 1102 comprises a current source comprising a pnp transistor $T_{10}$ whose base receives the voltage $V_{tune}$, whose emitter is connected through a resistor 1104 to the supply rail Vcc and whose collector is connected to a node 1106 between the collector of the gate transistor $T_8$ and the common emitters of the regenerative pair of transistor elements $T_3$ and $T_4$. No extra current is injected at the sense pair of transistors $T_1$, $T_2$ and no level shift is applied to the clock signals Clk and Clk_n. The current $I_r$ in the sense pair of transistors $T_1$ and $T_2$ and the current $(I_h-I_{tune})$ in the regenerative pair of transistors $T_3$ and $T_4$ are shifted relative to each other in level by the amount $I_{tune}$. Consequently, the sense period duration is prolonged while the store period is shortened.

In yet another embodiment of the invention (not shown), the current injector 602 is connected for injecting current of one polarity to the input pair of transistor elements $T_1$, $T_2$ and the current injector 1102 is connected for injecting current of opposite polarity to the regenerative pair of transistor elements $T_3$, $T_4$.

Figure 12:
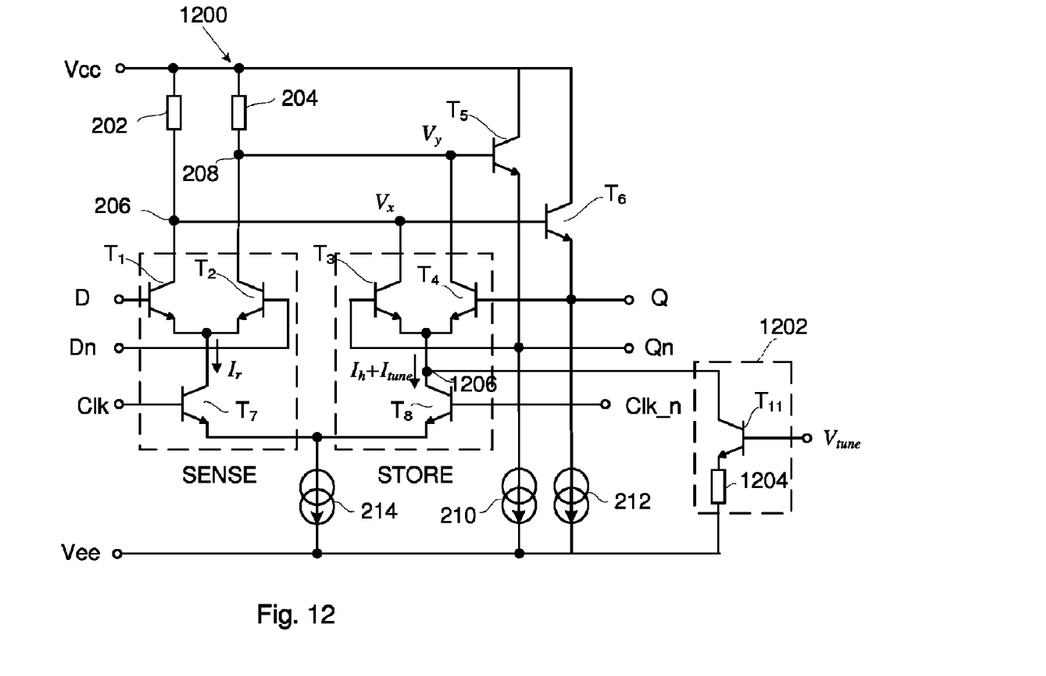
FIG. 12 is a schematic diagram of a latch module in accordance with yet another embodiment of the present invention, given by way of example.

For high speed operation, it is desirable to prolong the sense period relative to the store period. However, for operation at lower speeds it can be appropriate to prolong the store period relative to the sense period. Such asymmetric operation is obtained with the gated D latch module 1200 of FIG. 12 in accordance with yet another embodiment of the present invention. In FIG. 12, elements similar to those in previous Figures bear similar references, even if their function is not necessarily identical.

The latch module 1200 is similar to the latch module 600 of FIG. 6 except that the current injector 602 injecting current to the input pair of transistor elements $T_1$, $T_2$ in parallel with the corresponding gate transistor element $T_7$ so that the sense periods are of greater duration than the store periods is replaced by a current injector 1202 injecting a current in parallel with the regenerative pair of transistor elements $T_3$, $T_4$ to the corresponding gate transistor element $T_8$, so that the sense periods are of shorter duration than the store periods. More specifically, the current injector 1202 comprises a current source comprising a transistor $T_{11}$ whose base receives the voltage $V_{tune}$, whose emitter is connected through a resistor 1204 to the supply rail Vee and whose collector is connected to a node 1206 between the collector of the gate transistor $T_8$ and the common emitters of the regenerative pair of transistors $T_3$ and $T_4$. No extra current is injected at the sense pair of transistor elements $T_1$, $T_2$ and no level shift is applied to the clock signals Clk and Clk_n. The current $I_r$ in the sense pair of transistors $T_1$ and $T_2$ and the current $(I_h+I_{tune})$ in the regenerative pair of transistors $T_3$ and $T_4$ are shifted relative to each other in level by the amount $I_{tune}$. Consequently, the store period duration is prolonged while the sense period is shortened In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

The semiconductor substrate of the transistors described herein can be any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designated as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designated as either negative or positive logic signals. Therefore, in alternative embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, a plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, it will be appreciated that conductivity types and polarities of potentials may be reversed.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of the system described are circuitry located on a single integrated circuit or within a same device. Alternatively, the system may include any number of separate integrated circuits or separate devices interconnected with each other.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A latch module comprising:
   a sense pair of transistor elements coupled together for sensing a differential input signal at input terminals;
   a level-shift module for producing a differential output signal at output terminals;
   a regenerative pair of transistor elements coupled together and with said sense pair for holding said output signal through said level-shift module;
   a pair of gate transistor elements connected in series respectively with said sense pair of transistor elements and with said regenerative pair of transistor elements and responsive to an alternating differential gate signal to activate alternately said sense pair during sense periods and said regenerative pair during store periods; and
   a current injector for injecting current between at least one of said gate transistors and the corresponding sense or regenerative pair of transistor elements so that said sense periods are of different duration from said store periods;
   wherein said current injector is responsive to a tuning signal to control the relative durations of said sense periods and said store periods.

2. A latch module as claimed in claim 1, wherein said current injector is arranged to inject said current between at least one of said gate transistors and the corresponding sense or regenerative pair of transistor elements so that said sense periods are of greater duration than said store periods.

3. A latch module as claimed in claim 2, wherein said current injector is connected for injecting current to said sense pair of transistor elements in parallel with the corresponding one of said gate transistor elements.

4. A frequency divider comprising first and second latch modules, the first latch module as claimed in claim 3 and the second latch module as claimed in claim 3, said output terminals of said first latch module being connected to supply said output signal of said first latch module to said input terminals of said second latch module, said output terminals of said second latch module being connected to supply said output signal of said second latch module inverted to said input terminals of said first latch module, and said second latch module being responsive to said gate signal inverted relative to the gate signal to which said first latch module is responsive.

5. A frequency divider comprising first and second latch modules, the first latch module as claimed in claim 2 and the second latch module as claimed in claim 2, said output terminals of said first latch module being connected to supply said output signal of said first latch module to said input terminals of said second latch module, said output terminals of said second latch module being connected to supply said output signal of said second latch module inverted to said input terminals of said first latch module, and said second latch module being responsive to said gate signal inverted relative to the gate signal to which said first latch module is responsive.

6. A frequency divider comprising first and second latch modules, the first latch module as claimed in claim 1 and the second latch module as claimed in claim 1, said output terminals of said first latch module being connected to supply said output signal of said first latch module to said input terminals of said second latch module, said output terminals of said second latch module being connected to supply said output signal of said second latch module inverted to said input terminals of said first latch module and said second latch module being responsive to said gate signal inverted relative to the gate signal to which said first latch module is responsive.

* * * * *